(12) United States Patent
Dakshinamurthy et al.

(10) Patent No.: US 11,287,443 B2
(45) Date of Patent: Mar. 29, 2022

(54) HIGH PERFORMANCE ACCELEROMETER

(71) Applicant: INVENSENSE, INC., San Jose, CA (US)

(72) Inventors: Sriraman Dakshinamurthy, San Jose, CA (US); Vadim Tsinker, Belmont, CA (US); Matthew Julian Thompson, Beaverton, OR (US)

(73) Assignee: INVENSENSE, INC., San Jose, CA (US)

(*) Notice: Subject to any disclaimer, the term of this patent is extended or adjusted under 35 U.S.C. 154(b) by 113 days.

(21) Appl. No.: 16/794,952

(22) Filed: Feb. 19, 2020

(65) Prior Publication Data

US 2020/0264210 A1 Aug. 20, 2020

Related U.S. Application Data

(60) Provisional application No. 62/808,095, filed on Feb. 20, 2019.

(51) Int. Cl.
*G01P 15/13* (2006.01)
*G01P 15/08* (2006.01)

(52) U.S. Cl.
CPC .......... *G01P 15/13* (2013.01); *G01P 15/0802* (2013.01); *B81B 2201/0235* (2013.01); *G01P 2015/084* (2013.01)

(58) Field of Classification Search
CPC .... G01P 15/13; G01P 15/0802; G01P 15/125; G01P 2015/084; G01P 15/08
See application file for complete search history.

(56) References Cited

U.S. PATENT DOCUMENTS

| | | | | |
|---|---|---|---|---|
| 4,845,464 A | * | 7/1989 | Drori | B60R 25/1004 340/429 |
| 5,053,671 A | * | 10/1991 | Kobayashi | G01P 15/0922 310/329 |
| 7,732,302 B2 | * | 6/2010 | Yazdi | G01C 19/5719 438/456 |
| 2005/0016273 A1 | * | 1/2005 | Murata | G01P 15/125 73/514.32 |
| 2006/0061372 A1 | * | 3/2006 | Hayakawa | G01P 15/18 324/679 |
| 2007/0159183 A1 | * | 7/2007 | Umemura | G01D 5/2417 324/661 |
| 2008/0079444 A1 | * | 4/2008 | Denison | G01D 5/24 324/679 |
| 2008/0191714 A1 | * | 8/2008 | Masuda | G01P 15/125 324/661 |
| 2015/0214912 A1 | | 7/2015 | Khenkin | |

(Continued)

*Primary Examiner* — Helen C Kwok
(74) *Attorney, Agent, or Firm* — Haley Guiliano LLP; Joshua Van Hoven

(57) ABSTRACT

A MEMS accelerometer includes a suspended spring-mass system that has a frequency response to accelerations experienced over a range of frequencies. The components of the suspended spring-mass system such as the proof masses respond to acceleration in a substantially uniform manner at frequencies that fall within a designed bandwidth for the MEMS accelerometer. Digital compensation circuitry compensates for motion of the proof masses outside of the designed bandwidth, such that the functional bandwidth of the MEMS accelerometer is significantly greater than the designed bandwidth.

19 Claims, 6 Drawing Sheets

(56) References Cited

U.S. PATENT DOCUMENTS

| | | | |
|---|---|---|---|
| 2016/0077126 A1* | 3/2016 | Jeong | G01P 15/125 |
| | | | 702/104 |
| 2016/0187136 A1* | 6/2016 | Murakami | G01C 19/5776 |
| | | | 73/504.12 |
| 2018/0091900 A1 | 3/2018 | Parker | |
| 2020/0011702 A1* | 1/2020 | Clark | G01C 25/005 |

\* cited by examiner

HIGH PERFORMANCE ACCELEROMETER

CROSS-REFERENCE TO RELATED APPLICATIONS

This application claims priority benefit under 35 U. S. C. § 119(e) from U.S. provisional application No. 62/808,095 entitled "High Performance Accelerometer" and filed on Feb. 20, 2019. The aforementioned, earlier-filed application is hereby incorporated by reference herein in its entirety.

BACKGROUND

Numerous items such as smartphones, smart watches, tablets, automobiles, aerial drones, appliances, aircraft, exercise aids, and game controllers utilize sensors during their operation (e.g., motion sensors, pressure sensors, temperature sensors, etc.). In commercial applications, microelectromechanical (MEMS) sensors such as accelerometers and gyroscopes capture complex movements and determine orientation or direction. For example, smartphones are equipped with accelerometers and gyroscopes to understand the movement of the smartphone, to augment navigation systems that rely on Global Position System (GPS) information, and to perform numerous other functions. Wearable devices and internet-of-things (IoT) devices constantly measure movement and other characteristics of a person, animal, or electronic device. In another example, drones and aircraft determines orientation based on gyroscope measurements (e.g., roll, pitch, and yaw) and vehicles of all types implement assisted driving to improve safety (e.g., to recognize skid or roll-over conditions).

MEMS sensors such as MEMS accelerometers are being implemented in an ever-increasing number and variety of end-use applications. As technologists begin to understand the wide array of information that can be instantaneously acquired and/or calculated from MEMS sensors, new product designs are constantly pushing the limits of the technical requirements for MEMS sensors. For example, an exemplary MEMS sensor such as a MEMS accelerometer may have specifications for parameters such as range, sensitivity, bandwidth, noise, size, shape, and power consumption. Design changes intended to improve certain aspects of a specified parameter may create adverse impacts on other specified parameters. For example, MEMS accelerometer designs that may increase range and/or sensitivity may decrease bandwidth and increase size and power consumption.

SUMMARY

In some embodiments of the present disclosure, a microelectromechanical (MEMS) accelerometer may comprise a suspended spring-mass system comprising at least one proof mass that moves in response to acceleration, wherein the suspended spring-mass system has a designed bandwidth for sensing acceleration. The MEMS accelerometer may further comprise sense circuitry coupled to receive an acceleration signal from the suspended spring-mass system, wherein a gain of the acceleration signal for the sensed acceleration is uniform while the sensed acceleration corresponds to the designed bandwidth, and wherein the gain varies when a frequency of the sensed acceleration exceeds the designed bandwidth. The MEMS accelerometer may further comprise compensation circuitry configured to receive a sense signal that is based on an output of the sensing circuitry, wherein the compensation circuitry is further configured to modify the gain of the sense signal when the frequency of the sensed acceleration exceeds the designed bandwidth.

In some embodiments of the present disclosure, a method for operating a MEMS accelerometer may comprise outputting, by sense circuitry, a sense signal that is based on a movement of at least one proof mass of a suspended spring-mass system, wherein the suspended spring-mass system has a designed bandwidth for sensing acceleration. The method may further comprise receiving, by compensation circuitry, the sense signal, wherein a gain associated with the sense signal is uniform while the sensed acceleration corresponds to the designed bandwidth, and wherein the gain associated with the sense signal varies when a frequency of the sensed acceleration exceeds the designed bandwidth. The method may further comprise modifying, by the compensation circuitry, the gain of the sense signal while the frequency of the sensed acceleration exceeds the designed bandwidth.

BRIEF DESCRIPTION OF THE DRAWINGS

The above and other features of the present disclosure, its nature, and various advantages will be more apparent upon consideration of the following detailed description, taken in conjunction with the accompanying drawings in which.

DETAILED DESCRIPTION OF THE DRAWINGS

Figure 1:
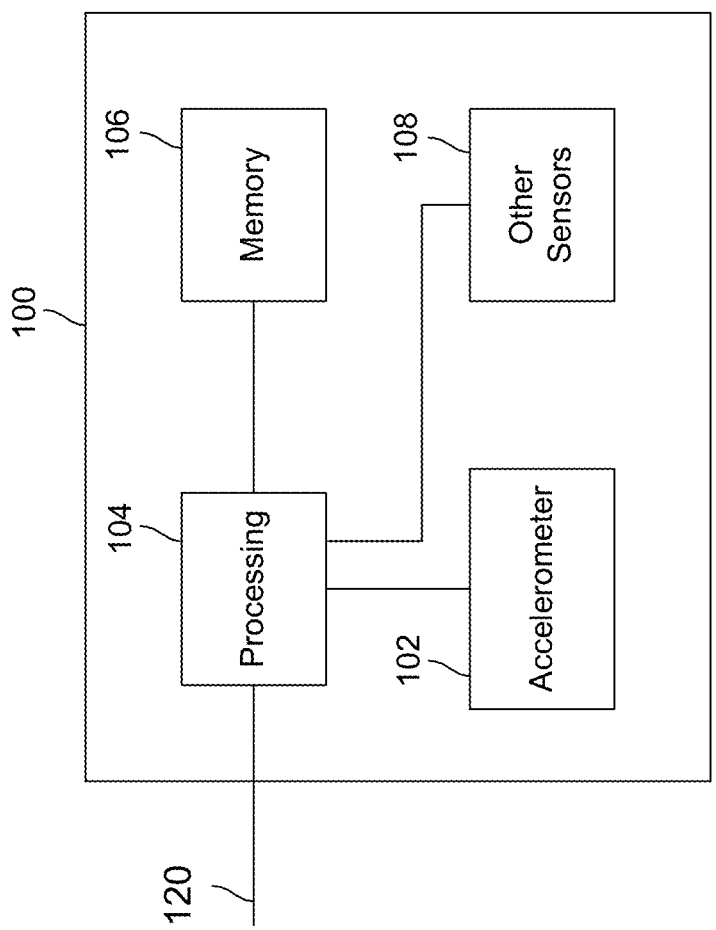
FIG. 1 depicts an exemplary motion sensing system in accordance with at least some embodiments of the present disclosure.

MEMS accelerometers have a variety of designs for different applications, and MEMS accelerometer design and integration includes numerous design tradeoffs. MEMS accelerometer designs with high sensitivity (e.g., responsiveness to smaller accelerations) and range may have a relatively low designed bandwidth within which the components of the MEMS accelerometer (e.g., proof masses of a suspended spring-mass system) respond in a uniform (e.g., proportional) manner to acceleration. The response of the MEMS accelerometer (e.g., movement of the proof masses) to accelerations at a frequency outside of this designed bandwidth (e.g., at or near the resonance frequency for the MEMS accelerometer) diverges widely as compared to the response of the accelerometer to an acceleration of the same magnitude within the designed bandwidth. Accordingly, high-sensitivity accelerometers may have a limited usable bandwidth. Attempts to increase the usable bandwidth without sacrificing sensitivity require larger accelerometers or high-power sense circuitry, which in turn consume significantly more power.

The MEMS components of a high-sensitivity MEMS accelerometer may have a frequency response over a range of frequencies, where a gain of the MEMS accelerometer (e.g., the relative degree of movement of the proof masses of the MEMS accelerometer in response to different magnitudes of linear acceleration) changes as a function of the frequency of the acceleration. Within a range of frequencies corresponding to the designed bandwidth (e.g., from zero Hz to a threshold frequency), this gain may be relatively uniform. However, outside of the designed bandwidth, and particularly at frequencies at, near, or above the resonance frequency (or frequencies), the gain may vary substantially (e.g., by orders of magnitude greater or less than) the gain within the designed bandwidth of the accelerometer.

The MEMS components of the high-sensitivity MEMS accelerometer may be output an acceleration signal to low-power sense circuitry such as capacitance-to-voltage converters, mixers, analog-to-digital converters, decimators, and gain/offset/sensitivity circuitry, which processes the movement of the MEMS components to output a sense signal representative of acceleration while the frequency of the sensed acceleration is within the designed bandwidth. When the frequency of the acceleration is outside of the sensed bandwidth, digital compensation circuitry (e.g., a digital compensation filter such as an infinite impulse response filter or finite impulse response sensor) modifies the sense signal in a manner that is complementary to the frequency response (e.g., gain) outside of the designed bandwidth. In this manner, the MEMS accelerometer provides accurate acceleration readings both within the designed bandwidth and outside of the designed bandwidth (e.g., including frequencies at, near, or above the resonance frequency or frequencies).

A calibration procedure may be applied to the MEMS accelerometer to set compensation values (e.g., a compensation signal, compensation coefficients, compensation waveform, compensation table, etc.) for accelerations having a frequency outside of the designed bandwidth. The calibration procedure can apply test accelerations having known magnitudes and frequencies externally (e.g., using a test fixture) or internally (e.g., using integrated test electrodes of the accelerometer) to the accelerometer and measure uncompensated and/or compensated outputs from the accelerometer. Compensation values can be selected based on open loop (e.g., measuring uncompensated outputs, then applying those to compensation circuitry) and/or closed loop (e.g., actively modifying compensation values while applying an acceleration outside of the designed bandwidth until the output magnitude is properly compensated to scale to the known input magnitude) procedures, and may be further refined as necessary. In some embodiments, the calibration procedure may be applied at multiple temperatures (e.g., as applied at a test fixture or sensed by a product in the field) to account for temperature dependency of the accelerometer frequency response.

FIG. 1 depicts an exemplary motion sensing system 100 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the motion sensing system may include at least a MEMS accelerometer 102 (e.g., a single- or multi-axis accelerometer for measuring linear acceleration along one or more axes) and supporting circuitry, such as processing circuitry 104 and memory 106. In some embodiments, one or more additional sensors 18 (e.g., MEMS gyroscopes, additional MEMS accelerometers, MEMS microphones, MEMS pressure sensors, and a compass) may be included within the motion processing system 100 to provide an integrated motion processing unit ("MPU") (e.g., including 3 axes of MEMS gyroscope sensing, 3 axes of MEMS accelerometer sensing, microphone, pressure sensor, and compass).

Processing circuitry 104 may include one or more components providing necessary processing based on the requirements of the motion processing system 100. In some embodiments, processing circuitry 104 may include hardware control logic that may be integrated within a chip of a sensor (e.g., on a substrate or cap of a MEMS accelerometer 102 or other sensor 108, or on an adjacent portion of a chip to the MEMS accelerometer 102 or other sensor 108) to control the operation of the MEMS accelerometer 102 or other sensors 108 and perform aspects of processing for the MEMS accelerometer 102 or other sensors 108. In some embodiments, the MEMS accelerometer 102 and other sensors 108 may include one or more registers that allow aspects of the operation of hardware control logic to be modified (e.g., by modifying a value of a register). In some embodiments, processing circuitry 104 may also include a processor such as a microprocessor that executes software instructions, e.g., that are stored in memory 106. The microprocessor may control the operation of the MEMS accelerometer 102 by interacting with the hardware control logic, and process signals received from MEMS accelerometer 102. The microprocessor may interact with other sensors in a similar manner.

Although in some embodiments (not depicted in FIG. 1), the MEMS accelerometer 102 or other sensors 108 may communicate directly with external circuitry (e.g., via a serial bus or direct connection to sensor outputs and control inputs), in an embodiment the processing circuitry 104 may process data received from the MEMS accelerometer 102 and other sensors 108 and communicate with external components via a communication interface 110 (e.g., a SPI or I2C bus, in automotive applications a controller area network (CAN) or Local Interconnect Network (LIN) bus, or in other applications suitable wired or wireless communications interfaces as is known in the art). The processing circuitry 104 may convert signals received from the MEMS accelerometer 102 and other sensors 108 into appropriate measurement units (e.g., based on settings provided by other computing units communicating over the communication bus 110) and perform more complex processing to determine measurements such as orientation or Euler angles, and in some embodiments, to determine from sensor data whether a particular activity (e.g., walking, running, braking, skidding, rolling, etc.) is taking place. In some embodiments, some or all of the conversions or calculations may take place on the hardware control logic or other on-chip processing of the MEMS accelerometer 102 or other MEMS sensors 108.

In some embodiments, certain types of information may be determined based on data from multiple MEMS inertial sensors 102 and other sensors 108, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

An exemplary MEMS accelerometer 102 may include one or more movable proof masses that are configured in a manner that permits the MEMS sensor to measure a desired force (e.g., linear acceleration) along an axis. In an exemplary embodiment, the MEMS accelerometer 102 may be a high performance accelerometer that is configured to provide high sensitivity, high bandwidth, and low noise without requiring a substantial increase in package size or power consumption as compared to a standard low-bandwidth MEMS accelerometer. For example, the MEMS accelerometer may have a quality factor ("Q factor") such as 0.5-3. A high performance MEMS accelerometer may include a high-sensitivity MEMS accelerometer. Low power receive circuitry (e.g., a low power frontend amplifier) may receive an output signal from the MEMS accelerometer and output a signal having a value (e.g., a voltage and/or current) that corresponds to the movement of components of the MEMS accelerometer (e.g., the movement of one or more proof masses relative to one or more sense electrodes). The signal output by the receive circuitry may be further processed by a number of additional steps (e.g., A/D conversion, decimation, gain/offset/sensitivity control, etc.) to output a sense signal that is a digital representation of the sensed linear acceleration. The sense signal may be further processed by compensation circuitry such as digital compensation circuitry that modifies the sense signal at bandwidths that are outside of the sense bandwidth of the MEMS accelerometer.

Figure 2:
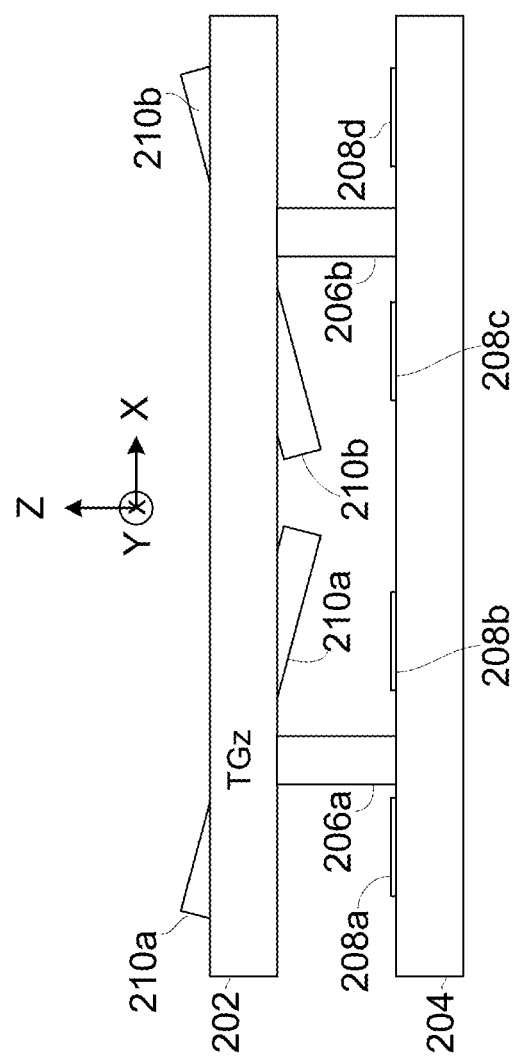
FIG. 2 depicts an exemplary MEMS accelerometer in accordance with at least some embodiments of the present disclosure.

FIG. 2 shows an exemplary MEMS accelerometer in accordance with some embodiments of the present disclosure. The exemplary MEMS accelerometer of FIG. 2 is simplified for the purposes of illustration. It will be understood that a high-performance MEMS accelerometer as described in the present disclosure may include a variety of suitable MEMS sensor designs that meet the sense characteristics herein (e.g., relatively high sensitivity coupled with bandwidth limitations) and is integrated with appropriate receive circuitry and compensation circuitry as described herein.

An illustrative MEMS accelerometer 200 comprises MEMS layer 202, CMOS layer 204, and anchors 206a and 206b separating and located within a gap between the two layers. Packaging and additional layers (e.g., cap layer) are not shown in FIG. 2 for ease of illustration but may be coupled to the MEMS layer 202 and/or CMOS layer 204 to form a hermetically sealed cavity in which the movable MEMS components of a suspended spring-mass system (e.g., proof masses 210a and 210b, and springs and/or masses coupled thereto) are able to move. The cavity may have a nominal pressure (e.g., at or near atmospheric pressure, or another suitable pressure for other particular designs). In the exemplary embodiment of FIG. 2, a bottom plane of the suspended spring-mass system of the MEMS layer 202 is located parallel to an upper plane of the CMOS layer 204 and the electrodes 208a-208d located thereon.

Anchors 206a and 206b extend between CMOS layer 204 and MEMS layer 202, and in the embodiment of FIG. 2, may extend such that the anchors 206a and 206b are perpendicular to each of CMOS layer 204 and MEMS layer 202. MEMS layer 202 includes a suspended spring mass system including proof masses 210a and 210b, which are suspended from anchors 206a and 206b, respectively, by interconnected springs and/or masses (not visible in FIG. 2). The components of the suspended spring mass system are sized and configured in a manner to facilitate movement of the proof masses 210a and 210b in response to an inertial force to be measured, e.g., linear acceleration in the direction of the z-axis. For example, an illustrative MEMS accelerometer 200 depicts a spring-mass system including movable proof masses 210a and 210b and springs (not depicted in FIG. 2, but located within and patterned from MEMS layer 202). The springs of the spring mass system are coupled between the proof masses 210a/210b and the anchors 206a/206b, and are selectively patterned and positioned such that they are relatively rigid in directions in which it is not desired to measure linear acceleration (e.g., in the embodiment of FIG. 2, in the x-axis and y-axis directions within the MEMS layer 202) and relatively flexible in a direction in which linear acceleration is being measured (e.g., in the embodiment of FIG. 2, in the z-axis direction).

Proof mass 210a is suspended over electrodes 208a and 208b and proof mass 210b is suspended over electrodes 208c and 208d. In response to a z-axis linear acceleration experienced by the MEMS accelerometer (e.g., due to movement of a device including the MEMS accelerometer at least partially along the z-axis) the proof masses 210a and 210b rotate out of the plane of the MEMS layer (e.g., about the y-axis) such that portions of the proof mass move closer to or farther away from respective electrodes, with the direction of the rotation based on whether the linear acceleration is in the positive z-axis or negative z-axis, with the degree of rotation (e.g., how much the proof masses move with respect to the respective electrodes) based on the magnitude of the acceleration, and with the frequency of changes in rotation based on the frequency of change of the underlying movement. The design of the suspended spring mass system may be such that the proof masses 210a and 210b have minimal movement out of plane in response to acceleration in directions other than linear acceleration in the direction of the z-axis.

In the exemplary embodiment of FIG. 2, the movement of the proof masses 210a and 210b out of the MEMS layer plane may be sensed using electrostatic sensing as depicted in FIG. 2. Fixed electrodes 208a, 208b, 208c, and 208d are located parallel to the proof masses (e.g., on CMOS layer 204 below proof masses 210a and 210b) to form capacitors with portions of the proof masses (e.g., electrode 208a forms a capacitor with a first portion of proof mass 210a, electrode 208b forms a capacitor with a second portion of proof mass 210a, electrode 208c forms a capacitor with a first portion of proof mass 210b, and electrode 208d forms a capacitor with a second portion proof mass 210b). The capacitance of each of the proof masses may change based on the relative distance between each proof mass portion and its associated sense electrodes. In the embodiment of FIG. 2, the capacitances are used by processing circuitry in the CMOS layer 204 to determine linear acceleration. Although electrostatic sensing is described in the embodiment of FIG. 2, it will be understood that other forms of sensing (e.g., piezoelectric, infrared, piezo resistive, or magnetic) may be used. While some or all of the processing circuitry may be described as located within a CMOS layer 204 as described herein, in some embodiments a substrate may not include active processing components, and may instead simply perform functions such as routing signals to other processing circuitry (e.g., on adjacent components to the MEMS sensor and/or stacked on layers above or below the substrate or cap of the MEMS sensor).

Although the exemplary embodiment of FIG. 2 has been described in reference to an out-of-plane MEMS accelerometer, such as a z-axis accelerometer, it will be understood that the accelerometers, devices, systems, and methods described herein may be applied to a variety of suitable MEMS accelerometer designs, such as in-plane sensing MEMS accelerometers, x-axis and/or y-axis accelerometers, and combinations thereof.

Figure 3:
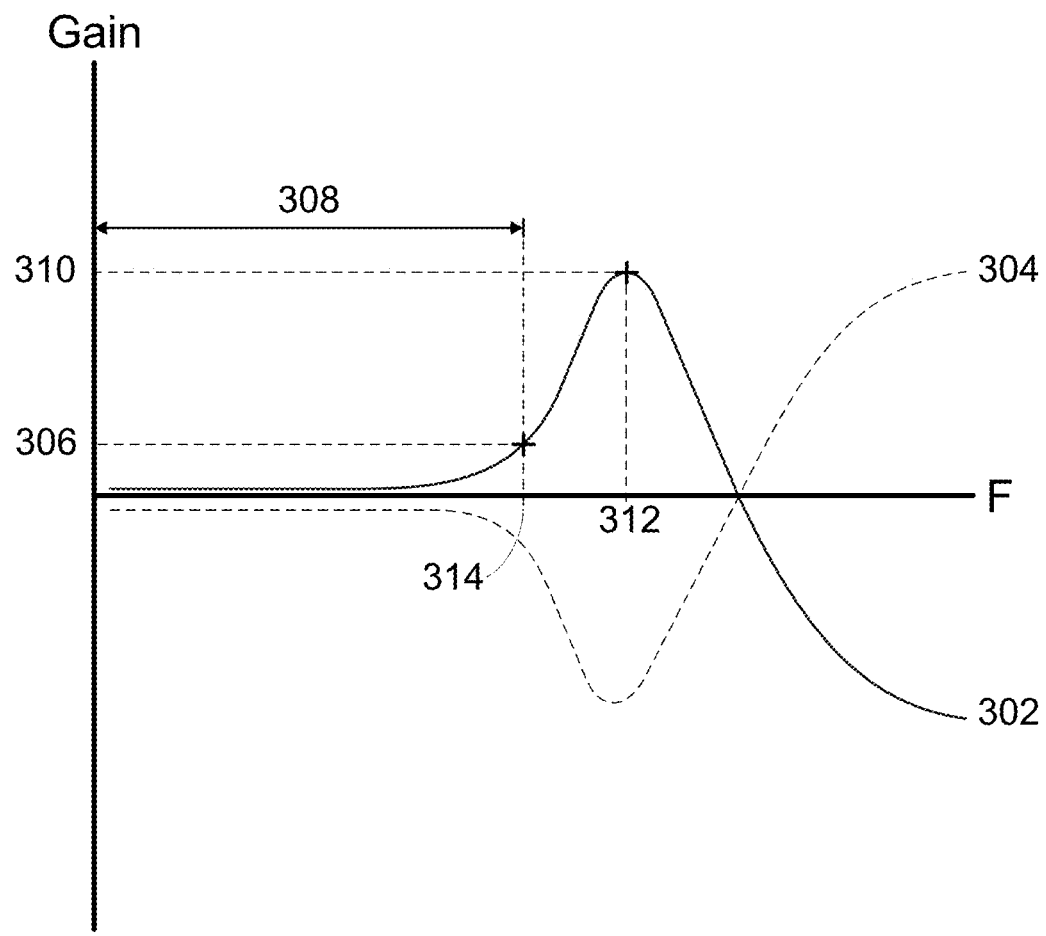
FIG. 3 depicts an exemplary bandwidth plot of a MEMS accelerometer and bandwidth compensation in accordance with some embodiments of the present disclosure.

FIG. 3 depicts an exemplary bandwidth plot of a MEMS accelerometer and bandwidth compensation in accordance with some embodiments of the present disclosure. In the exemplary plot of FIG. 3, the abscissa represents a linear scale of frequency of linear acceleration and the ordinate represents a dB-scale gain of the MEMS accelerometer. The gain of the MEMS accelerometer may correspond to an electrical response of the MEMS accelerometer (e.g., an acceleration signal supplied to sense circuitry as described herein, and output from the sense circuitry as a sense signal) in response to a particular linear acceleration experienced by the MEMS accelerometer along the sense axis for the accelerometer. For example, a relatively low gain may generally correspond to a first electrical response of the MEMS accelerometer (e.g., due to measurement of the movement of at least one proof mass of an exemplary spring-mass system relative to at least one sense electrode) to a first linear acceleration experienced by the proof mass. A larger gain value means that the corresponding electrical response of the MEMS accelerometer (e.g., due to measurement of the movement of the at least one proof relative to the at least one sense electrode) to the same first linear acceleration will be greater. As depicted in FIG. 3, the gain of the MEMS accelerometer may be dependent upon the frequency of the linear acceleration.

Although it will be understood that different accelerometer designs have different gains, different resonance frequency values, multiple resonance frequencies, and different shapes of frequency responses, in the exemplary embodiment of FIG. 3 a first gain plot may correspond to a frequency response 302 of an exemplary MEMS accelerometer in accordance with some embodiments of the present disclosure. The frequency response 302 may reach a maximum gain 310 at a resonance frequency 312 for the MEMS accelerometer. Within an operational frequency range 308 the gain may remain below a threshold level 306 such that the gain is substantially consistent throughout the operational frequency range 308 (e.g., with a gain variation of less than 10% percent or 1 dB). Within the operational frequency range 308 (e.g., corresponding to a designed bandwidth of the MEMS accelerometer) a measured acceleration signal from the MEMS accelerometer may be proportional (e.g., within a range of 10%) to the linear acceleration. As the frequency of the linear acceleration exceeds the threshold frequency 314 associated with the threshold gain 306 (e.g., exceeds the designed bandwidth), the gain varies non-linearly with the frequency until it reaches the resonance frequency 312, and then decreases nonlinearly, eventually becoming negative.

In an embodiment of the present disclosure, a compensation signal 304 may be identified (e.g., using calibration procedures as described herein) for the MEMS accelerometer. The compensation signal 304 may be a complementary signal (or an approximation of a complementary signal) to the frequency response 302, e.g., such that at any frequency of the linear acceleration the gain of the compensation signal 304 has a complementary gain value (e.g., the same magnitude of gain in dB and opposite sign, or an approximation thereof) as compared to the frequency response 302. For frequencies within the operational frequency range 308, it may not be necessary to consider the corresponding value of the compensation signal 304 when determining linear acceleration from an acceleration signal of the MEMS accelerometer. At frequencies that exceed the threshold frequency (e.g., are outside of the designed bandwidth) of the MEMS accelerometer, values of the compensation signal 304 that correspond to the frequency of the linear acceleration may be used to modify measured values of the acceleration signal from the MEMS accelerometer, such that the magnitude of the modified values accurately correspond to the actual magnitude of the linear acceleration, even beyond the designed bandwidth of the MEMS accelerometer.

Figure 4:
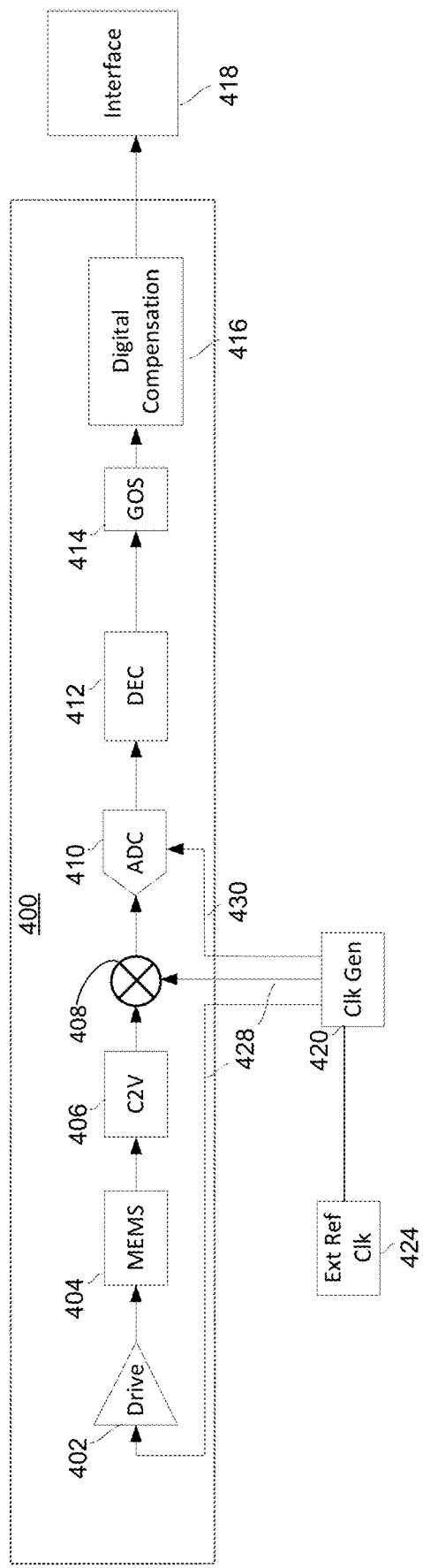
FIG. 4 depicts an exemplary high performance MEMS accelerometer in accordance with at least some embodiments of the present disclosure.

FIG. 4 depicts an exemplary high performance MEMS accelerometer in accordance with at least some embodiments of the present disclosure. Although the exemplary high performance MEMS accelerometer is depicted with particular components, it will be understood that in some embodiments the MEMS accelerometer may include other components, one or more components may be replaced or removed, and/or components depicted or described herein may be removed.

In an embodiment of the present disclosure, a clock generator 420 may receive a clock signal from a clock source 424 such as an external reference clock, although in some embodiments a clock source 424 may be collocated with the MEMS accelerometer, for example, on a common chip with other components of a sensor fusion chip. However the clock source 424 is provided to the clock generator 420, the clock source 424 may have a frequency that is significantly higher (e.g., an order of magnitude or more) than a frequency that is provided to the components of the MEMS accelerometer by the clock generator 420. The clock generator may provide a number of clock signals to components of the MEMS accelerometer, such as an accelerometer drive signal 428 that is provided to accelerometer drive 402 and mixer 408, and an analog-to-digital sampling signal 430 that is provided to analog-to-digital converter 410.

An accelerometer drive signal 428 may have a frequency suitable for modulating a signal that is generated due to movement of the proof mass(es) of the MEMS components 404 (e.g., sense electrodes and a spring mass system including a movable proof masses) of MEMS accelerometer 400. For example, if the MEMS components 404 are expected to sense external linear accelerations having a frequency in a range of kilohertz, the accelerometer drive signal 428 may have a frequency that is selected to be greater than the frequency of the external accelerations. A drive 402 includes suitable components to apply a periodic signal (e.g., sine wave, square wave, etc.) at a drive voltage to the MEMS components (e.g., the proof masses and/or sense electrodes), which, in an embodiment, does not cause movement of the proof mass relative to the sense electrodes but instead functions as a carrier signal for the underlying signal created as a result of linear acceleration.

In the absence of a linear acceleration along the sense axis of the MEMS accelerometer 400, the proof masses of the MEMS components 404 may be substantially stationary, such that an acceleration signal output by the MEMS components 404 (e.g., by one or more capacitors formed by proof masses and sense electrodes) substantially corresponds to the carrier frequency of the drive signal provided by drive 402. The MEMS components 404 may have a relatively high sensitivity and a relatively low bandwidth, such that the proof masses are highly sensitive to any linear acceleration along the sense axis but experience a varying gain outside of a relatively narrow bandwidth (e.g., have a relatively low resonance frequency).

In the presence of linear acceleration along the sense axis of the MEMS accelerometer 400, the proof masses of the MEMS components 404 will move along the sense axis to modulate the carrier signal based on the magnitude and frequency of the linear acceleration. As described herein, for linear accelerations having a frequency within a designed bandwidth of the MEMS components, the magnitude of the movement of the proof masses, and thus the modulation of the carrier signal output by the MEMS components as an acceleration signal, will substantially scale in proportion to the linear acceleration. If the linear accelerations are occurring at frequencies outside of the designed bandwidth (e.g., exceeding the designed bandwidth), then the magnitude of the movement of the proof masses and the resulting acceleration signal, and thus the modulation of the carrier signal output as an acceleration signal, will not scale in proportion to the magnitude of the linear acceleration and may instead evidence a gain that is many times greater or less than the gain within the designed bandwidth.

A variety of sense circuitry may measure and process the acceleration signal generated by the movement of the proof masses (e.g., the modulations of the drive/carrier signal caused by movement of the proof masses), for example, by measuring and processing the capacitances of the MEMS components 404. Although in some embodiments additional circuitry may be added to the sense circuitry, components may be substituted or removed, and the order of processing may be modified, in the exemplary embodiment of FIG. 4 the sense circuitry may include a capacitance-to-voltage (C2V) converter 406, mixer 408, analog-to-digital converter (ADC) 410, decimator 412, and gain/offset/sensitivity filters 414.

An exemplary C2V stage 406 (or a plurality of C2Vs associated with respective capacitors) may measure an acceleration signal corresponding to changes in capacitance due to movement of the proof masses of the MEMS components 404 as those movements modulate the carrier/drive signal, and may output an analog signal that has a voltage and/or current that is useful for further processing. For example, C2V stage 406 may output a signal that includes the drive/carrier signal and that has an envelope corresponding to the magnitude and frequency of the movement of the proof masses of the MEMS components 404. In accordance with the present disclosure, the C2Vs of the C2V stage 406 may include low-power amplifiers that are selected for compatibility with the high-sensitivity MEMS components 404 of the MEMS accelerometer 400, thus providing a high sensitivity to changes in capacitance due to movement of the proof masses with minimal power consumption or noise sensitivity. The analog output signal from the C2V stage 406 may be provided to mixer 408, which also receives drive/carrier signal 428 from clock generator 420, such that mixer 408 may remove the drive/carrier signal content from the analog output signal of C2V stage 406.

The analog output of mixer 408 has a voltage and/or current that substantially corresponds to the magnitude and frequency of the acceleration signal generated by the movement of the proof masses of MEMS components 404, and may be provided to ADC 410. Although a variety of types of ADCs may be used in different embodiments of the present disclosure, in an exemplary embodiment of the present disclosure the ADC 410 may be a delta-sigma ADC. In an embodiment, the sampling signal 430 provided to the ADC 410 by clock generator 420 may have a frequency that is approximately two or more orders of magnitude greater than expected frequencies of linear acceleration to be sensed by the MEMS components, for example, to provide for oversampling of the underlying analog signal according to Nyquist-Shannon sampling theorem. The digital output of the ADC 410 may be provided to decimator 412, which may reduce the frequency of the digital output to a value suitable for further processing, e.g., at least an order of magnitude greater than typical frequencies of linear acceleration to be sensed by the accelerometer. It will be understood that while a particular configuration of components (e.g., ADC 410 and decimator 412) may perform the conversion of the analog signal representing acceleration to a digital signal having a suitable number of samples for particular processing, in some embodiments the functions of the ADC 410 and decimator 412 may be combined and/or one or more additional filters such as low-pass (e.g., corresponding to a bandwidth of interest for sensed linear acceleration) may be provided before analog-to-digital conversion.

The digital signal representing of the acceleration signal due to movement of the proof masses (e.g., from decimator 412) may be provided to gain/offset/sensitivity scaling circuitry 414 in some embodiments. This circuitry may modify the digital signal in a variety of manners in order to better match the measurements of linear acceleration that are output from the particular accelerometer 400 to expected linear acceleration values. For example, during design, manufacture, pre-shipment testing, in-field testing, or other procedures, characteristics of a particular accelerometer, build of accelerometers, or accelerometer design may be evaluated and measured. In order to maintain uniformity of outputs between different accelerometers and accelerometer types, the measured outputs may be scaled linearly (e.g., gain and/or sensitivity scaling), in absolute terms (e.g., offset scaling), or in other suitable manners. Once the digital signal is properly scaled by GOS circuitry 414, the resulting signal may be provided to a digital compensation circuitry 416.

As described herein, the sense circuitry may be implemented in a variety of manners, including with the specific components described in FIG. 4 (e.g., C2V stage 406, mixer 408, ADC 410, decimator 412, and GOS stage 414). The output of the sense circuitry to the digital compensation circuitry 416 may be referred to herein as a sense signal that is a digital representation of the acceleration signal generated by movement of the proof masses and that is sampled at a suitable rate (e.g., greater than an expected range of frequency of the sensed accelerations). As described herein, the MEMS components 404 of the MEMS accelerometer 400 that move in response to a sensed linear acceleration may be sensitive to even low-magnitude accelerations. However, accelerometer designs that have such high sensitivity may have a relatively small designed bandwidth, for example, corresponding to a relatively low resonance frequency at which the gain of the accelerometer becomes non-linear. Digital compensation circuitry 416 processes a received sense signal received from such accelerometers in a manner that allows for accurate measurement of accelerations having a frequency outside of the designed bandwidth, including around and above the range of the resonance frequency for the accelerometer.

The digital compensation circuitry 416 may process the received sense signal to compensate for non-linear gain characteristics outside of the designed frequency for the accelerometer such that a modified sense signal is proportional to the applied acceleration. The digital compensation circuitry 416 comprises processing circuitry as described herein, and can be implemented as code executing a microprocessor, discrete components, programmable hardware components, other processing circuitry, and combinations thereof. The digital compensation circuitry 416 may process the sense signal in accordance with a compensation signal 304, for example, that is complementary to a frequency response 302 of the MEMS components 404 of the MEMS accelerometer 400. Although a compensation signal 304 may be identified in a variety of manners, in some embodiments of the present disclosure the compensation signal may be identified by a calibration procedure.

In some embodiments, the digital compensation filter 416 may implement compensation in accordance with the compensation signal 304 by a digital compensation filter. Exemplary digital compensation filters include infinite impulse response ("IIR") filters and finite impulse response ("FIR") filters. The transfer function of the digital compensation filter may be designed such that the sense signal is not processed or undergoes minimal processing within the designed bandwidth of the MEMS components 404 of the MEMS accelerometer 400, but is processed in accordance with the compensation signal 304 outside of the designed bandwidth (e.g., around and above the resonance frequency) such that the resulting processed sense signal output from the digital compensation circuitry accurately reflects the magnitude of the linear acceleration (e.g., is proportional to the linear acceleration) even outside of the designed bandwidth. In this manner, the MEMS accelerometer 400 may provide high-sensitivity, low-power, and low-noise sensing within the designed bandwidth of the MEMS components 400 and also within an additional frequency range outside of the designed frequency range (e.g., including the resonance frequency).

Although not depicted in FIG. 4, the GOS stage 414 and/or the digital compensation circuitry 416 may modify the acceleration signal based on a temperature sensed by the MEMS accelerometer and/or received from a temperature sensor of an end-use device in communication with MEMS accelerometer. A frequency response of the MEMS accelerometer (e.g., MEMS accelerometer 400) may change based on temperature. Depending on the design of the MEMS accelerometer, the change in the frequency response may simply correspond to a change in gain, such that straightforward temperature-based scaling may be applied by either of the GOS stage 414 and/or the digital compensation circuitry 416. In some instances, the change to the frequency response may impact the designed bandwidths, resonance frequency, and frequency and gain thresholds that are used for applying compensation. The digital compensation circuitry 416 may store data (e.g., as determined by a calibration procedure) for adjusting the compensation based on temperature, such as multiple sets of compensation values for different temperature and/or coefficients for modification of acceleration values based on temperature.

The modified sense signal may be output from the digital compensation circuitry 416 of the MEMS accelerometer 400 to interface circuitry 418. (e.g., corresponding to other sense axes than the sense axis of accelerometer 400), and in some embodiments, other MEMS devices such as MEMS gyroscopes, MEMS pressure sensors, and the like. Interface circuitry may perform post-processing of the signals, such as performing self-tests and calculating sensor fusion values, before outputting the received signals and other signals to other components of an end-use device.

Figure 5:
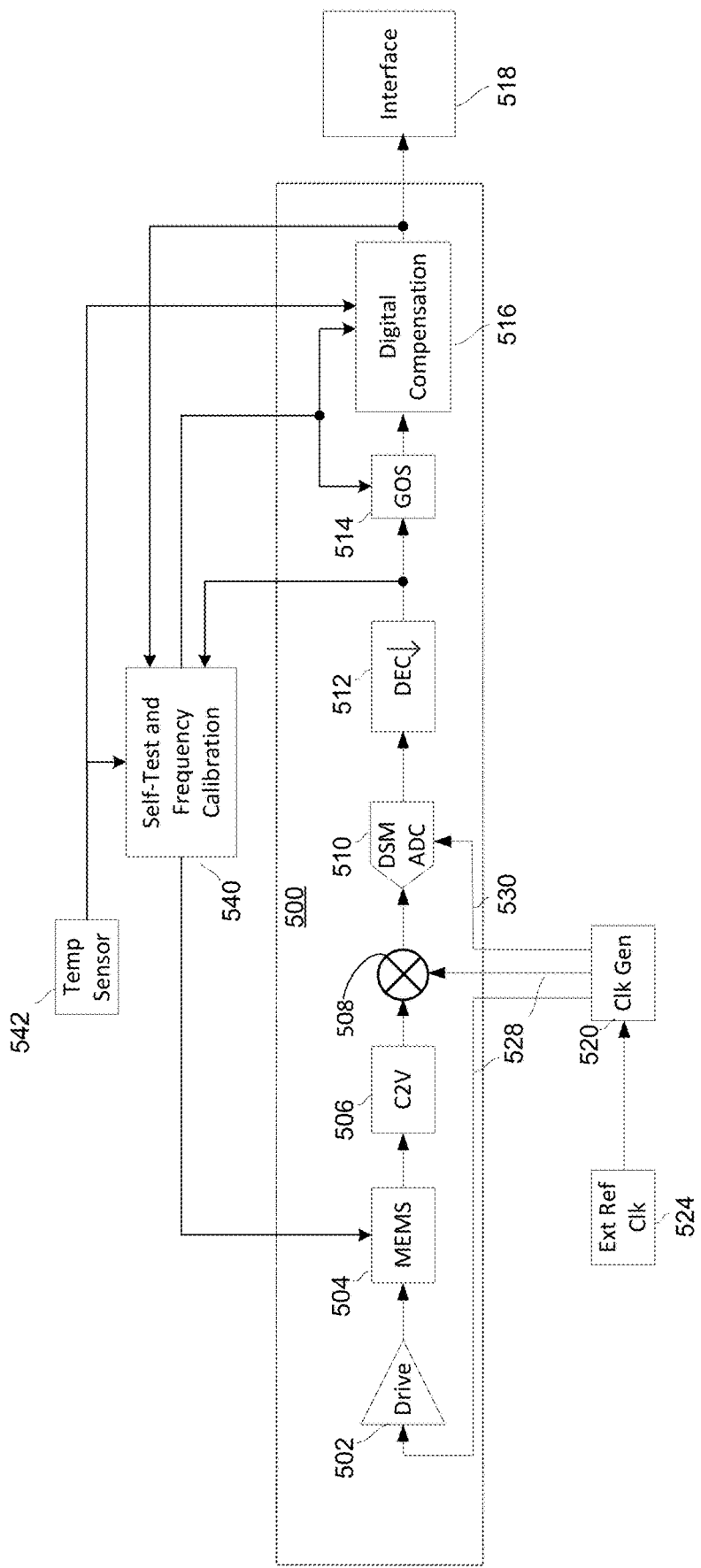
FIG. 5 depicts an exemplary calibration system for a MEMS accelerometer in accordance with at least some embodiments of the present disclosure.

FIG. 5 depicts an exemplary calibration system for a MEMS accelerometer in accordance with at least some embodiments of the present disclosure. Although the exemplary calibration system is depicted with particular components of calibration circuitry and a MEMS accelerometer 500, it will be understood that in some embodiments of either or both of the calibration circuitry and the MEMS accelerometer 500 may include other components, one or more components may be replaced or removed, and/or components depicted or described herein may be removed or combined. Calibration circuitry may be integral to the MEMS accelerometer 500 or to a multi-axis device of which the MEMS accelerometer 500 is a subpart to provide ongoing calibration during operation (e.g., by actuating test electrodes), or some or all of the calibration circuitry may be packaged separately from the MEMS accelerometer (e.g., as a test fixture used during manufacturing or as a separate component of an end-use device).

An exemplary accelerometer 500 has similar components to the accelerometer 400 of FIG. 4, with drive 502 corresponding to drive 402, MEMS components 504 corresponding to MEMS components 404, C2V stage 506 corresponding to C2V stage 406, mixer 508 corresponding to mixer 408, ADC 510 corresponding to ADC 410, ADC 512 corresponding to ADC 412, GOS stage 514 corresponding to GOS stage 414, and digital compensation circuitry 516 corresponding to digital compensation circuitry 416. Additionally, other components such as clock generator 520 and interface circuitry 518 may function similarly to clock generator 420 (e.g., to generate accelerometer drive signal 428/528 and ADC sampling signal 430/530) and interface 418 (e.g., to process and communicate the modified accelerometer signal output from digital compensation circuitry 418/518).

In an exemplary embodiment, calibration circuitry may include self-test and frequency calibration circuitry 540, temperature sensor 542, and external reference clock 524, although certain of these components may be combined or omitted (e.g., external reference clock 524, and/or temperature sensor 542), or some of the calibration circuitry (e.g., temperature sensor 542 and/or self-test and frequency calibration circuitry 540) may be integrated into accelerometer 500 or the associated packaging thereof, into discrete devices, or as part of production equipment. Self-test and frequency calibration circuitry 540 comprises processing circuitry as described herein, and can be implemented as code executing a microprocessor, discrete components, programmable hardware components, other processing circuitry, and combinations thereof. Self-test and frequency calibration circuitry 540 is physically and electrically coupled to the accelerometer 500 to interface with components thereof such as MEMS components 504, the decimator 512 output signal, GOS stage 514, digital compensation circuitry 516, and the signal from output of digital compensation circuitry 516. In other embodiments, the self-test and frequency calibration circuitry 540 can interface with other components and receive other signals (e.g., such as receiving analog output signals from MEMS components 504 or a digital sense signal output from GOS stage 514).

The self-test and frequency calibration circuitry 540 may cause movement of the MEMS components 504 (i.e., proof masses) according to known test acceleration patterns of magnitude and frequency. The test accelerations may be applied in a number of suitable manners, such as by causing movement of accelerometer according to the test acceleration patterns (e.g., in a test fixture during operation or in-field calibration) or by test electrodes that are integral to the MEMS components 504 to cause movement of the proof masses. The test patterns can cycle the MEMS components 504 through a variety of acceleration magnitudes and frequencies. The response of the MEMS components 504 to the particular test acceleration patterns may be sensed at suitable output nodes within the sense circuitry, such as at an output of decimator 512 as depicted in FIG. 5. For example, a digital output from decimator 512 may be indicative of the raw sensed proof mass movement of proof masses of MEMS components 504 due to the acceleration patterns, without any modifications for gain, offset, and sensitivity (e.g., by GOS stage 514) or by the digital compensation circuitry 516. The comparison of the input test acceleration pattern to the raw acceleration data may be used to construct a model of the frequency response (e.g., such as frequency response 302) for the particular accelerometer 500 and MEMS components 504 thereof.

The self-test and frequency calibration circuitry 540 may also provide control signals to modify the operation (e.g., by monitoring scaling factors, offsets, filter coefficients, etc.) of the GOS stage 514 and digital compensation circuitry 516 in accordance with a compensation signal (e.g., a compensation signal 304 generated based on compensation signal 302). In some embodiments, the values for the control signals may be based on a measured frequency response. Once the control signals have appropriately modified the operation of the digital calibration circuitry 516 (and in some embodiments, GOS stage 514), the modified accelerometer signal output from the digital calibration circuitry 516 may be tested to confirm that the digital compensation circuitry 516 in fact compensates for proof mass responses to frequencies outside of the designed bandwidth. In some embodiments, the compensation signal may be determined directly from the test acceleration patterns and the output from digital compensation circuitry 516 (e.g., without reference to a measured frequency response without digital compensation, such as at the output of decimator 512) in a closed loop fashion, for example, by modifying the control signals provided to the digital compensation circuitry 516 while the applied acceleration is outside of the designed bandwidth until the output of the digital compensation circuitry 516 matches the magnitude of the applied acceleration.

The frequency response 302 of the MEMS accelerometer 500 may also be at least partially temperature dependent. Accordingly, the temperature of the MEMS accelerometer 500 may be measured during the calibration process. In some embodiments, the temperature may be varied (e.g., in a test fixture) or calibration testing may be performed over time (e.g., to experience different temperatures in the field) to determine changes in the frequency response 302 (and thus the required compensation signal 304) due to changes in temperature. In some embodiments, the temperature used during calibration may merely be noted during calibration and temperature may be monitored during operation. If the temperature departs from the temperature used during calibration by more than a threshold, corresponding changes may be implemented by the digital compensation the compensation circuitry 516.

Figure 6:
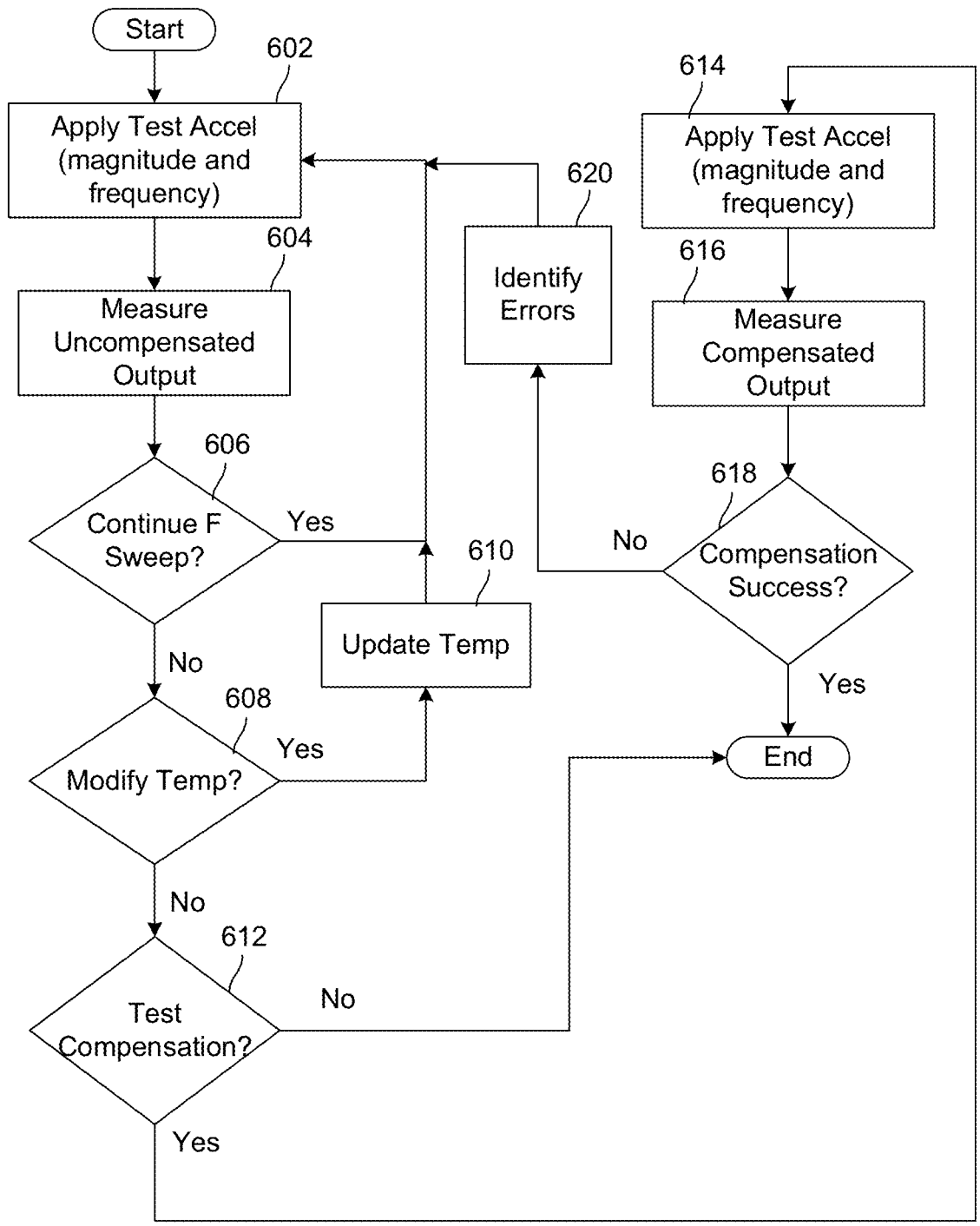
FIG. 6 depicts exemplary steps for calibration and operation of an exemplary high performance MEMS accelerometer in accordance with at least some embodiments of the present disclosure.

FIG. 6 depicts exemplary steps for calibration and operation of an exemplary high performance MEMS accelerometer in accordance with at least some embodiments of the present disclosure. Although FIG. 6 is described in the context of the particular structures and components of the present disclosure, it will be understood that the methods and steps described in FIG. 6 may be applied to a variety of MEMS accelerometer designs, compensation methods, processing circuitry, and calibration techniques. Although a particular order and flow of steps is depicted in FIG. 6, it will be understood that in some embodiments one or more of the steps may be modified, moved, removed, or added, and that the flow depicted in FIG. 6 may be modified.

Exemplary steps for calibration and compensation may begin at step 602, at which a test acceleration having a particular magnitude and frequency is applied to the accelerometer. Self-test and frequency calibration circuitry may apply a known acceleration force at a known frequency, for example, by operating a test fixture to move the MEMS accelerometer or by initiating a movement of proof masses of the MEMS accelerometer such as by actuating test electrodes of the MEMS accelerometer. However the test acceleration is applied to the MEMS accelerometer, the movement of the proof masses causes the components of the sense circuitry (e.g., a C2V stage, mixer, ADC, decimator, GOS stage, etc.) to process signals generated by the movement of the proof masses.

At step 604, uncompensated outputs of the sense circuitry may be measured by the self-test and frequency calibration circuitry as analog or digital signals, such as from outputs of any of the components of the sense circuitry. The uncompensated outputs may be measured over a suitable amount of time or number of samples and the measured values (e.g., representing a magnitude and frequency of the uncompensated signal or signals) may be associated with the magnitude and frequency of the test acceleration applied at step 602.

At step 606, it may be determined whether the sweep of the test accelerations is complete. For example, it may be desired to test a series of magnitudes (e.g., five to ten magnitudes covering the entire sensitivity range of the particular MEMS accelerometer design) from the low for each frequency over a range of frequencies that are expected to include the designed bandwidth of the MEMS accelerometer, the resonance frequency (or frequencies), and a range of frequencies less than and greater than the resonance frequency. If the entire range of test acceleration has been applied and measured through steps 602 and 604, then processing may continue to step 608. If more test accelerations need to be applied, processing may return to step 602.

At step 608, it may be determined whether additional acceleration testing should be performed for other temperatures. For example, a test fixture or end-use device may be able to apply an increased or decreased temperature to the MEMS accelerometer (e.g., for an end-use device, by performing the MEMS accelerometer soon after startup when the device is "cold" and again at a later point when adjacent components such as processors, displays, and communication circuitry have heated up). In order to understand temperature effects on the frequency response, the test accelerations may also be applied at different temperatures. The changes to the frequency response curves due to temperature may be determined and extrapolated for use by the digital compensation circuitry based on measured temperatures during operation of the MEMS accelerometer. If additional temperatures are to be applied, processing continues to 610 at which the temperature of the MEMS accelerometer is changed or the system waits until a suitable temperature for additional testing is sensed, after which processing returns to step 602 to apply additional test accelerations to the MEMS accelerometer. If additional temperature-related testing is not required, processing continues to step 612.

At step 612, compensation values (e.g., a compensation signal, compensation coefficients, compensation waveform, compensation table, etc.) may be determined from the frequency response(s) determined in steps 602-610. In some embodiments, this information may be provided to the digital compensation circuitry (e.g., as executable code, coefficients, look-up tables, selections among stored compensation signals, and suitable combinations thereof) for use in the MEMS sensor without additional testing, and the processing of FIG. 6 may end. In an exemplary embodiment not depicted in FIG. 6, the identification of a compensation routine may be determined in a closed loop by directly changing the compensation routine while the test frequencies are being applied, until the output of the digital compensation circuitry corresponds to the magnitude of the acceleration applied to the MEMS accelerometer. In some embodiments as depicted in FIG. 6, the compensation routine may be updated at the digital compensation circuitry and may be tested in steps 614-620.

At step 614, a test acceleration having a particular magnitude and frequency is applied to the MEMS accelerometer. Self-test and frequency calibration circuitry may apply a known acceleration force at a known frequency, for example, by operating a test fixture to move the MEMS accelerometer or by initiating a movement of proof masses of the MEMS accelerometer such as by actuating test electrodes of the MEMS accelerometer. However the test acceleration is applied to the MEMS accelerometer, the movement of the proof masses causes the components of the sense circuitry (e.g., a C2V stage, mixer, ADC, decimator, GOS stage, etc.) as well as the digital compensation circuitry to process signals generated by the movement of the proof masses.

At step 616, the compensated outputs of the digital compensation circuitry may be measured by the self-test and frequency calibration circuitry as a digital output signal. The compensated outputs may be measured over a suitable amount of time or number of samples and the measured values (e.g., representing a magnitude and frequency of the uncompensated signal or signals) may be associated with the magnitude and frequency of the test acceleration applied at step 614. Although not depicted after step 616, a range of magnitudes and frequencies may be applied at steps 614 and 616 until a suitable corpus of test data has been obtained (e.g., within the designed bandwidth, at the resonance frequency, and at frequencies within the non-linear range above and below the resonance frequency).

At step 618, it may be determined from the compensated output values whether the compensation was successful. If the compensation was not successful, processing may continue to step 620 at which the problematic regions (e.g., frequencies or ranges within the MEMS accelerometer's sensitivity range) are identified. These can be noted to create updated test acceleration routines tailored to the problematic regions at steps 602-612. If the compensation was successful, the calibration may end.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical (MEMS) accelerometer, comprising:
    a suspended spring-mass system comprising at least one proof mass that moves in response to acceleration, wherein the suspended spring-mass system has a designed bandwidth for sensing acceleration;
    sense circuitry coupled to receive an acceleration signal from the suspended spring-mass system, wherein a gain of the acceleration signal is uniform while a frequency of the acceleration signal corresponds to the designed bandwidth for sensing acceleration, and wherein the gain of the acceleration signal varies when the frequency of the acceleration signal exceeds the designed bandwidth for sensing acceleration; and
    compensation circuitry configured to receive a sense signal that is based on an output of the sensing circuitry, wherein a gain of the sense signal is based on the gain of the acceleration signal, wherein the compensation circuitry is further configured to modify the gain of the sense signal when the frequency of the acceleration signal exceeds the designed bandwidth for sensing acceleration, and wherein the modification of the gain of the sense signal is complementary to a frequency response of the suspended spring-mass system at the frequency of the acceleration signal.

2. The MEMS accelerometer of claim 1, wherein the sense circuitry comprises a capacitance-to-voltage ("C2V") converter.

3. The MEMS accelerometer of claim 1, wherein the compensation circuitry comprises a compensation filter that modifies the designed bandwidth of the MEMS.

4. The MEMS sensor of claim 1, wherein the sense circuitry further comprises filtering circuitry, wherein the filtering circuitry modifies the gain of the acceleration signal, an offset of the acceleration signal, or a sensitivity of the acceleration signal, and wherein an output of the filtering circuitry comprises the sense signal.

5. The MEMS accelerometer of claim 1, wherein the MEMS accelerometer has a quality factor greater than 0.7.

6. The MEMS accelerometer of claim 1, wherein the compensation circuitry comprises a digital compensation filter.

7. The MEMS accelerometer of claim 6, wherein the digital compensation filter comprises a FIR filter.

8. The MEMS accelerometer of claim 6, wherein the digital compensation filter comprises an IIR filter with poles and zeros.

9. The MEMS accelerometer of claim 6, wherein a transfer function of the digital compensation filter is a function of temperature.

10. The MEMS accelerometer of claim 1, further comprising:
    a test input coupled to the suspended spring-mass system, wherein the test input is configured to receive a plurality of test motion signals to apply to the suspended spring-mass system to cause test movements of the at least one proof mass at a plurality of test frequencies; and
    a test output coupled to the sense circuitry to output a plurality of test acceleration signals associated with the plurality of test frequencies.

11. The MEMS accelerometer of claim 10, wherein a self-test circuit associated with the test input and the test output measures the designed bandwidth based on the test motion signals and the test acceleration signals.

12. The MEMS accelerometer of claim 10, further comprising calibration circuitry configured to generate the test input and to identify values for the modification of the sense signal based on the test motion signals and the test acceleration signals.

13. The MEMS accelerometer of claim 12, wherein the compensation circuitry modifies the gain of the sense signal based on the identified values.

14. The MEMS accelerometer of claim 12, wherein the calibration circuitry is further configured to measure a plurality of test temperatures, wherein the designed bandwidth or the modification of the sense signal is dependent on the test temperatures.

15. The MEMS accelerometer of claim 13, wherein the compensation circuitry is configured to modify the sense signal based on a sensed temperature.

16. A method for operating a MEMS accelerometer, comprising:
    outputting, by sense circuitry, a sense signal that is based on a movement of at least one proof mass of a suspended spring-mass system, wherein the suspended spring-mass system has a designed bandwidth for sensing acceleration;

receiving, by compensation circuitry, the sense signal, wherein a gain associated with the sense signal is uniform while a frequency of an acceleration represented by the sense signal corresponds to the designed bandwidth for sensing acceleration, and wherein the gain associated with the sense signal varies when the frequency of the acceleration exceeds the designed bandwidth for sensing acceleration; and modifying, by the compensation circuitry, the gain of the sense signal while the frequency of the acceleration exceeds the designed bandwidth for sensing acceleration, wherein the modification of the gain of the sense signal is complementary to a frequency response of the suspended spring-mass system at the frequency of the sense signal.

17. The method of claim 16, further comprising:
measuring a plurality of temperatures for the MEMS accelerometer;
measuring a plurality of sensed accelerations associated with a plurality of frequencies of the movement of the at least one proof mass; and
determining the modification of the sense signal based on the plurality of temperatures, the plurality of sensed accelerations, and the plurality of frequencies.

18. The method of claim 17, further comprising updating a plurality of values of the compensation circuitry based on the determined modification.

19. The method of claim 17, further comprising:
measuring a temperature associated with the sense signal; and
updating the modification of the gain of the sense signal based on the measured temperature.

* * * * *